(12) United States Patent
Chiang

(10) Patent No.: US 7,330,075 B2
(45) Date of Patent: Feb. 12, 2008

(54) OUTPUT IMPEDANCE CONTROL CIRCUIT AND CONTROL METHOD THEREOF

(75) Inventor: Ming-Cheng Chiang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 62 days.

(21) Appl. No.: 11/023,579

(22) Filed: Dec. 29, 2004

(65) Prior Publication Data

US 2005/0168285 A1 Aug. 4, 2005

(30) Foreign Application Priority Data

Jan. 30, 2004 (TW) .............................. 93102120 A

(51) Int. Cl.
H03F 3/45 (2006.01)
H03F 1/30 (2006.01)

(52) U.S. Cl. ..................................... 330/259; 330/290

(58) Field of Classification Search ............... 330/259, 330/290

See application file for complete search history.

(56) References Cited

U.S. PATENT DOCUMENTS

| | | | |
|---|---|---|---|
| 4,395,681 A * | 7/1983 | Hornung et al. ............ 330/259 |
| 4,701,719 A * | 10/1987 | Nagata ........................ 330/258 |
| 5,008,632 A * | 4/1991 | Sutterlin ..................... 330/256 |
| 5,254,956 A * | 10/1993 | Nishijima ................... 330/258 |
| 6,087,847 A | 7/2000 | Mooney et al. |
| 6,157,206 A | 12/2000 | Taylor et al. |
| 6,292,031 B1 * | 9/2001 | Thompson et al. ........... 327/66 |
| 6,333,623 B1 * | 12/2001 | Heisley et al. .............. 323/280 |
| 6,362,655 B1 | 3/2002 | Abraham et al. |
| 6,362,687 B2 * | 3/2002 | Cox ........................... 330/253 |
| 6,411,122 B1 | 6/2002 | Mughal et al. |
| 6,414,512 B1 | 7/2002 | Moyer |
| 6,424,169 B1 | 7/2002 | Partow et al. |
| 6,424,170 B1 | 7/2002 | Raman et al. |
| 6,429,679 B1 | 8/2002 | Kim et al. |
| 6,429,685 B1 | 8/2002 | Stockstad |
| 6,501,293 B2 | 12/2002 | Braceras et al. |
| 6,504,397 B1 | 1/2003 | Hart et al. |
| 6,525,558 B2 | 2/2003 | Kim et al. |
| 6,556,038 B2 | 4/2003 | Kim et al. |
| 6,560,290 B2 | 5/2003 | Ahn et al. |
| 6,573,746 B2 | 6/2003 | Kim et al. |
| 6,605,958 B2 | 8/2003 | Bergman et al. |
| 6,664,814 B1 * | 12/2003 | Evans et al. ................... 327/65 |
| 6,717,471 B2 * | 4/2004 | Arayashiki et al. ......... 330/278 |
| 6,774,722 B2 * | 8/2004 | Hogervorst ................. 330/258 |
| 6,778,019 B2 * | 8/2004 | Grasset et al. .............. 330/296 |
| 6,937,100 B2 * | 8/2005 | Anderson ................... 330/259 |
| 7,106,238 B2 * | 9/2006 | Chiang ....................... 341/155 |

* cited by examiner

Primary Examiner—Robert J. Pascal
Assistant Examiner—Krista M Flanagan
(74) Attorney, Agent, or Firm—Winston Hsu

(57) ABSTRACT

The invention provides an apparatus and a method for adjusting an output impedance of an output stage. The apparatus comprises a detector for outputting a direct current potential corresponding to the impedance of the output stage circuit. It also comprises a controlling unit for outputting a control signal according to the direct current potential and a reference potential, and for adjusting the output impedance of the output stage according to the control signal.

26 Claims, 3 Drawing Sheets

OUTPUT IMPEDANCE CONTROL CIRCUIT AND CONTROL METHOD THEREOF

BACKGROUND OF THE INVENTION

1. Field of the Invention

This present invention relates to an output stage. More particularly, the present invention relates to an impedance control apparatus for adjusting the output impedance of the output stage.

2. Description of the Prior Art

Please refer to FIG. 1; FIG. 1 shows the schematic diagram of the conventional output stage circuit 60 capable of adjusting the output impedance of an output stage 65. The output stage 65 comprises two adjustable resistor arrays 66-67 which are the same. One replica resistor array 68 that is replicated from the resistor array 66-67 is used to form an adjusting loop. The potential of the replica resistor array 68 is compared with a reference potential in order to produce a comparison signal, then the control logic 36 generates a control signal according to the comparison signal to adjust the output impedance of the output stage 65 of the output stage circuit 60, so as to obtain the preferred impedance of the output stage 65.

Because of the differences in the production process of electronic elements, which cause the drifting in the electronic characteristic of electronic elements (for example: resister, current source), it is difficult to replicate the exact same elements with the same characteristics, thus affecting the accuracy of the output impedance. Besides, the power consumption and the cost of the conventional output circuit are higher because the conventional output circuit needs these replica electronic elements.

SUMMARY OF THE INVENTION

The one of the objectives of present invention is to provide an output impedance control apparatus and a control method for increasing the accuracy of the output impedance of the output stage.

The one of the objectives of present invention is to provide an output impedance control apparatus and a control method for adjusting the output impedance of the output stage.

The invention provides an apparatus for adjusting an output impedance of an output stage for outputting an output signal. The apparatus comprises: a detector for detecting a direct current potential of the output signal; and a controlling unit for outputting a control signal in accordance with the direct current potential, and for adjusting the output impedance of the output stage in accordance with the control signal.

This invention provides a method for controlling an output impedance of an output stage for outputting an output signal. The method comprises the steps of: detecting a direct current potential of the output signal; generating a control signal according to the direct current potential; and adjusting the output impedance of the output stage according to the control signal.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
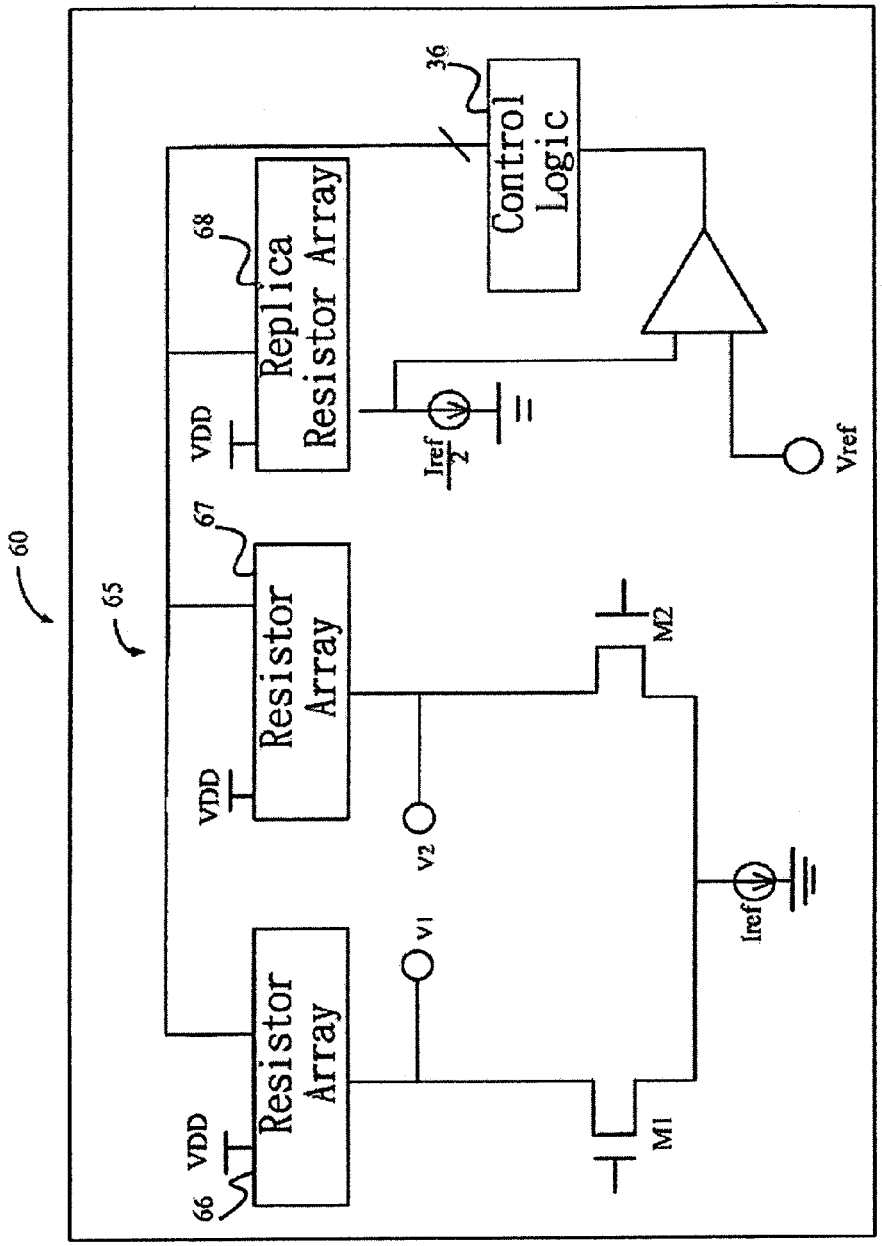
FIG. 1 shows the schematic diagram of the conventional output stage circuit capable of adjusting itself output impedance.
Figure 2:
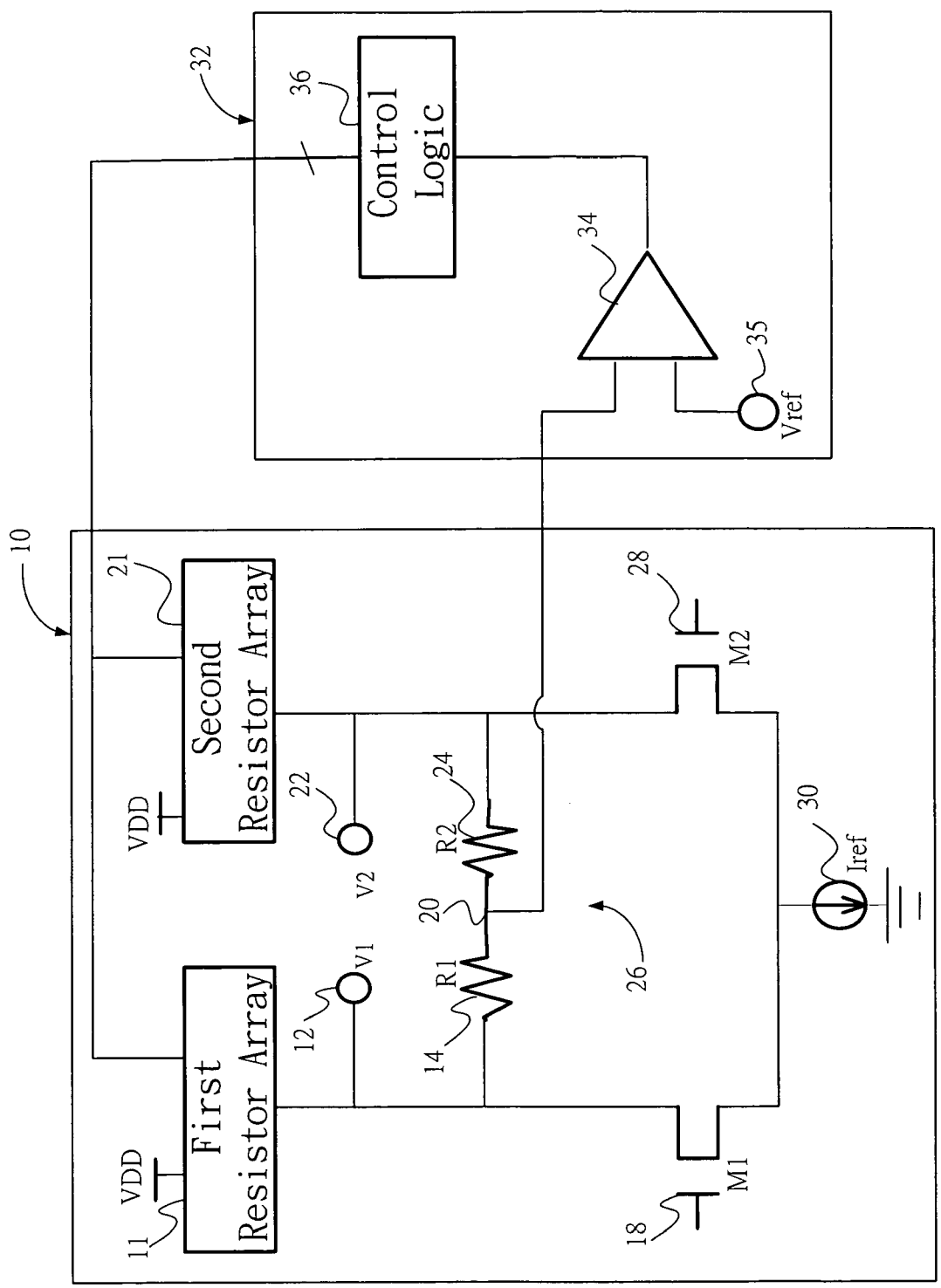
FIG. 2 shows the schematic diagram of an impedance control apparatus of the present invention for adjusting the output impedance of the output stage.

Please refer to FIG. 2; FIG. 2 shows the schematic diagram of an output stage circuit of the present invention capable of adjusting an output impedance of the output stage 10. The output stage circuit of the invention comprises an output stage 10 and an impedance control apparatus. The output stage 10 has a first output terminal 12 and a second output terminal 22 for outputting an output signal. In an embodiment, the output stage 10 comprises a current source 30, a first transistor 18, a second transistor 28, a first resistance array 11, and a second resistance array 21. The impedance control apparatus comprises a detector 26 and a controlling unit 32. The detector 26, which is coupled in between the first output terminal 12 and the second output terminal 22, detects and outputs a direct current (DC) potential of the output signal of the output stage 10. In an embodiment, the detector 26 comprises a first resistor 14 coupled to a second resistor 24 in series to form a node 20. The impedance of the first resistor 14 is substantially the same as that of the second resistor 24, and it is larger than the impedance of the output stage 10. The node 20 of the detector 26 outputs the direct current (DC) potential of the output signal.

The controlling unit 32 is coupled to the detecting unit 26 for adjusting the first and the second resistance arrays 11, and 21 of the output stage 10 according to the direct current potential and a reference potential, so as to adjust the impedance of the output stage 10.

In an embodiment, the controlling unit 32 comprises a comparator 34 and a control logic 36. The comparator 34 compares the direct current potential with the reference potential 35 and outputs a comparison result. The control logic 36 produces the control signal by counting the comparison result and outputs the control signal respectively to the first resistance array 11 and the second resistance array 21, whereby adjusting the first resistance array 11 and the second resistance array 21 to match the impedance of the external environment. In an embodiment, the comparator 34 can be an operation amplifier. The control logic 36 can be a counter. (OK)

Figure 3:
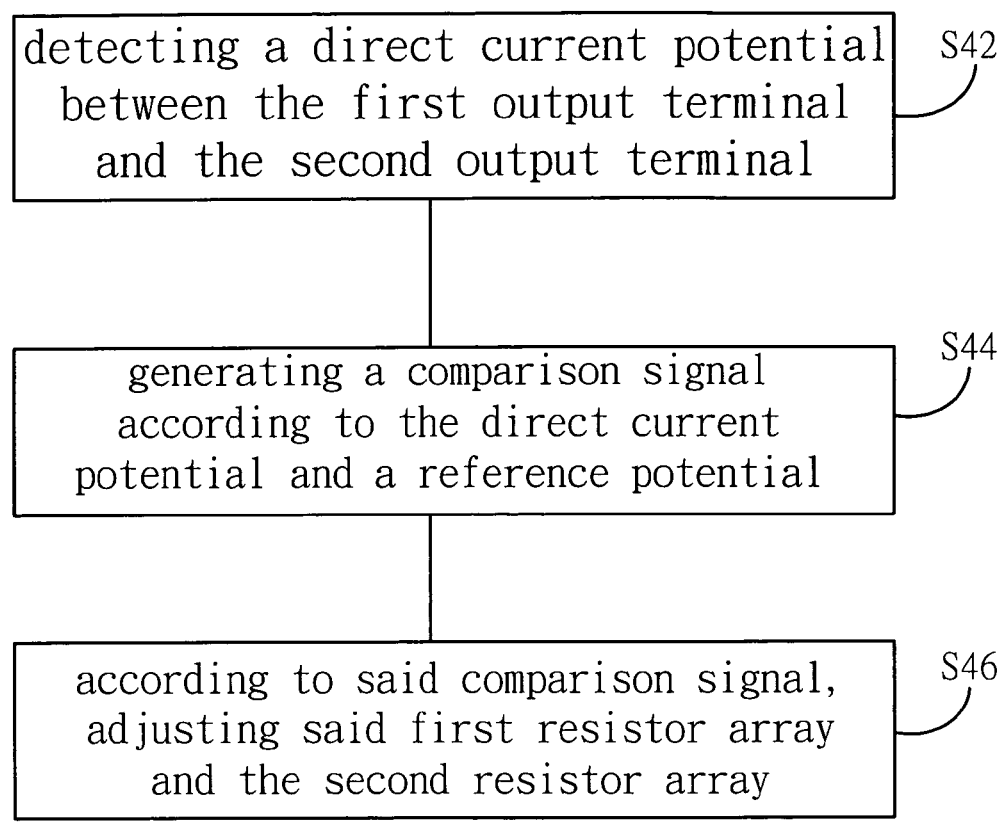
FIG. 3 shows the flow chart of a method for adjusting an output impedance of the output stage according to the present invention.

Please refer to FIG. 3; FIG. 3 shows the flow chart of the output impedance control method. It employs the output stage 10 of FIG. 2 to explain the method. The output impedance control method comprises the following steps:

S42: detecting a direct current potential between the first output terminal 12 and the second output terminal 22;

S44: generating a comparison signal according to the direct current potential and a reference potential 35;

S46: adjusting the first resistor array 11 and the second resistor array 21 according to the comparison signal. In an embodiment, the step S46 further comprises: counting the comparison signal to produce a control signal; and adjusting the first and the second resistor arrays according to the control signal.

The above explanation is applicable whether both the first switch 18 and the second switch 28 or only one of them is in the 'ON" condition.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An apparatus for adjusting an impedance of an output stage outputting an output signal, the apparatus comprising:
    a detector, for receiving the output signal and detecting a direct current signal of the output signal; and
    a controlling unit, coupled to the detector, for outputting a control signal according to the direct current signal from the detector, and for adjusting the impedance of the output stage according to the control signal;
    wherein the output signal is generated on two terminals of the output stage.

2. The apparatus of claim 1, wherein the controlling unit comprises:
    a comparator for comparing the direct current signal with a reference signal, and outputting a comparison result; and
    a control logic for outputting the control signal according to the comparison result.

3. The apparatus of claim 2, wherein the control logic comprises a counter.

4. The apparatus of claim 2, wherein the comparator comprises an operational amplifier.

5. The apparatus of claim 1, wherein the output stage comprises a first output terminal and a second output terminal for outputting the output signal, and the detector comprises:
    a first resistor, coupled to the first output terminal; and
    a second resistor having a first terminal, coupled to the second output terminal, and a second terminal, coupled to the first resistor to form a node, the node outputting the direct current signal.

6. The apparatus of claim 5, wherein the impedance of the first resistor is substantially the same as that of the second resistor.

7. The apparatus of claim 5, wherein the impedance of the first resistor and the impedance of the second resistor are larger than the impedance of the output stage.

8. The apparatus of claim 1, further comprising:
    an adjustable resistor array configured to provide the impedance of the output stage according to the control signal.

9. A method for controlling an impedance of an output stage for outputting an output signal, comprising:
    detecting a direct current signal of the output signal from the output stage by a detector;
    generating a control signal according to the direct current signal; and
    adjusting the impedance of the output stage according to the control signal;
    wherein the output signal is generated on two terminals of the output stage.

10. The method of claim 9, wherein the step of generating the control signal comprises:
    comparing the direct current signal with a reference signal to generate a comparison signal; and
    producing the control signal according to the comparison signal.

11. The method of claim 10, wherein the step of producing the control signal comprises: counting the comparison signal to produce the control signal.

12. The method of claim 9, wherein the output stage comprises a first output terminal and a second output terminal for outputting the output signal, and the detector comprises:
    a first resistor, coupled to the first output terminal; and
    a second resistor having a first terminal, coupled to the second output terminal, and a second terminal, coupled to the first resistor to form a node, the node outputting the direct current signal.

13. The method of claim 12, wherein the impedance of the first resistor is substantially the same as that of the second resistor.

14. The method of claim 12, wherein the impedance of the first resistor and the impedance of the second resistor are larger than the impedance of the output stage.

15. An output stage apparatus, comprising:
    an output stage for outputting an output signal, the output stage having an output impedance;
    a detector, coupled to the output stage, for detecting a direct current signal of the output signal; and
    a controlling unit for outputting a control signal according to the direct current signal and for adjusting the output impedance of the output stage according to the control signal;
    wherein the controlling unit comprises:
        a comparator for comparing the direct current signal with a reference signal, and outputting a comparison result; and
        a counter, coupled to the comparator, for counting the comparison result to generate the control signal.

16. The apparatus of claim 15, wherein the comparator comprises an operational amplifier.

17. The apparatus of claim 15, wherein the output stage comprises a first output terminal and a second output terminal for outputting the output signal, and the detector comprises:
    a first resistor coupled to the first output terminal; and
    a second resistor having a first terminal, coupled to the second output terminal, and a second terminal, coupled to the first resistance to form a node, the node outputting the direct current signal.

18. The apparatus of claim 17, wherein the impedance of the first resistor is substantially the same as that of the second resistor.

19. The apparatus of claim 17, wherein the impedance of the first resistor and the impedance of the second resistor are larger than the impedance of the output stage circuit.

20. The apparatus of claim 15, further comprising:
    an adjustable resistor array configured to provide the output impedance of the output stage according to the control signal.

21. An apparatus for adjusting an impendence of a terminal which is used for transferring a transferred signal, the apparatus comprising:
    a DC signal detector, coupled to the terminal, configured to receive the transferred signal and detect a direct current signal of the transferred signal; and
    a control circuit, coupled to the DC detector, configured to output a control signal according to the direct current signal from the DC detector, and adjust the impedance of the terminal according to the control signal;

wherein the terminal comprises a first terminal and a second terminal for transferring the transferred signal, and the DC detector comprises:

a first resistor, coupled to the first terminal; and a second resistor coupled to the second terminal and coupled to the first resistor to form a node for outputting the direct current signal;

wherein the impedance of the first resistor and the impendence of the second resistor are larger than the impedance of the terminal.

22. The apparatus of claim 21, further comprising:

an adjustable resistor array configured to provide the impedance of the terminal according to the control signal.

23. A method for controlling an impedance of a terminal for transferring an transferred signal, comprising:

detecting a direct current signal of the transferred signal from the terminal by a detector;

comparing the direct current signal and a predetermined value and thereby outputting a comparison result;

generating a control signal according to the comparison result; and adjusting the impedance of the terminal according to the control signal;

wherein the terminal comprises a first terminal and a second terminal, and the detector comprises:

a first resistor, couple to the first termnial and couple to the first resistor a second resistor, couple to the second terminal and couple to the first resistor to from a node, the node outputting the direct current signal;

wherein the impedance of the first resistor and the impendence of the second resistor are larger than the impedance of the terminal.

24. An apparatus for adjusting an impendence of a terminal which is used for transferring a transferred signal, the apparatus comprising:

a DC signal detector, coupled to the terminal, configured to receive the transferred signal and detect a direct current signal of the transferred signal;

a comparator, coupled to the DC signal detector, configured to compare the direct current signal with a reference signal, and output a comparison result;

a control logic, coupled to the comparator, configured to output the control signal according to the comparison result and adjust the impedance of the terminal according to the control signal; and an adjustable resistor array configured to provide the impedance of the terminal according to the control signal.

25. The apparatus of claim 24, the DC signal detector comprising:

a first resistor; and a second resistor coupled to the first resistor to form a node for outputting the direct current signal.

26. The apparatus of claim 24, wherein the control logic comprises a counter.

* * * * *